(12) United States Patent
Wensel

(10) Patent No.: US 6,555,412 B1
(45) Date of Patent: Apr. 29, 2003

(54) PACKAGED SEMICONDUCTOR CHIP AND METHOD OF MAKING SAME

(75) Inventor: Richard W. Wensel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/458,902

(22) Filed: Dec. 10, 1999

(51) Int. Cl.$^7$ .................. H01L 21/44; H01L 23/495
(52) U.S. Cl. ............... 438/106; 438/112; 438/124; 438/127; 257/667
(58) Field of Search ................. 438/113, 124, 438/460, 127, 617, 612, 106, 112, 15, 51, 64, 618, 48; 257/667, 787, 777

(56) References Cited

U.S. PATENT DOCUMENTS

| | | | |
|---|---|---|---|
| 5,332,864 A | * | 7/1994 | Liang et al. ............. 174/52.4 |
| 5,610,442 A | | 3/1997 | Schneider et al. .......... 257/787 |
| 5,674,785 A | | 10/1997 | Akram et al. ............. 438/15 |
| 5,885,854 A | | 3/1999 | Wensel .................. 438/127 |
| 5,909,056 A | | 6/1999 | Mertol .................. 257/704 |
| 5,950,070 A | * | 9/1999 | Razon et al. ............. 438/113 |
| 6,013,946 A | * | 1/2000 | Lee et al. ............... 257/666 |

* cited by examiner

Primary Examiner—Eddie Lee
Assistant Examiner—José R Díaz
(74) Attorney, Agent, or Firm—Ganz Law, PC; Bradley M. Ganz; James L. Wolfe

(57) ABSTRACT

The present invention provides a packaged chip that includes at least one dam disposed between the chip and interposer, blocking an encapsulant flow path in the package formed by the assembly of the interposer and chip. In one preferred embodiment, the dam comprises a lead-like structure formed on the interposer that closes an encapsulant flow path in the package. The invention further provides a novel interposer that may be assembled with a chip into the novel packaged chip. Methods are also provided for making the packaged chip and the interposer.

45 Claims, 4 Drawing Sheets

PACKAGED SEMICONDUCTOR CHIP AND METHOD OF MAKING SAME

BACKGROUND OF THE INVENTION

The present invention generally relates to packaging for a semiconductor chip and is particularly directed to providing a chip scale package for a chip. In certain embodiments, the invention relates to a packaging system that blocks encapsulant from flowing beyond areas intended to be encapsulated. The invention is particularly well suited for encapsulating connections formed between chip bonding pads and leads on a flexible substrate in a chip scale package.

After a chip is fabricated on a wafer and separated therefrom, it is packaged for protection and to facilitate its integration into a circuit on a printed circuit board ("PCB"), flexible printed circuit ("FPC"), or other board or electronic product (hereinafter such products are collectively referred to as "circuitry products"). The package also provides the chip (1) a lead system for connecting the chip to a PCB or other product; (2) physical protection; (3) environmental protection; and (3) a mechanism for heat dissipation. A package typically includes an enclosure or body, which may also be referred to herein as an "interposer." Enclosures may be made of ceramic, epoxy, and flexible substrates based on polyimide, for example. The enclosure also includes an inner lead system for electrically connecting to bonding pads on the chip and an outer lead system for electrically connecting the packaged chip to a circuitry product. Conductive traces may also be included between inner and outer lead systems.

Numerous packaging techniques exist. Generally, each involves putting the chip into an individual package, which can be connected directly to a circuit board; putting the chip into a multichip module ("MCM") with other chips that are packaged together; or using direct chip attachment ("DCA") to connect the chip to a circuitry product.

The chip may be electrically connected to the inner lead system of the package via bonding wires, solder balls, or other chip connectors bonded to the bonding pads of the chip. Typically, the chip's bonding pads are in an array along outer edges of the chip. However, as discussed in more detail below, a chip may have its bonding pads arrayed off the edges, for example, in the center of the chip.

The bonds formed between the chip bonding pads and the package lead system is typically covered or filled with an encapsulant to protect the bonds from physical and environmental damage and to preserve their function. In one conventional method suitable for use with chips having bonding pads at edges, chips are mounted upside down (circuitry side down) on a coverlay tape to encapsulate the non-circuitry side of the chip. In this process, the encapsulant flows along the tape and the chip to fill in the space left between the die and the substrate. The encapsulant is cured and the tape removed. One problem with this approach is containing the encapsulant in intended regions of application on the chip. However, liquid encapsulants pose certain problems. If the liquid is formulated too thick, it can leave voids after it solidifies. Interconnections that are covered by encapsulant having voids may not be protected adequately and may be adversely affected electrically. If encapsulant liquid is formulated too thin, it can flow beyond intended areas of the chip and interposer. Due to overflow of the encapsulant, the excess encapsulant must be trimmed off the chips. Thus to make an even-edged package, labor, time and cost are added to the packaging process.

Various forms of packaging have evolved based on the foregoing packaging fundamentals, including plastic ball grid array package (PBGA) and direct chip attach ("DCA"). Unfortunately, these and other conventional packaging techniques suffer from disadvantages. These disadvantages include excessive package size, weight, and cost. The packages may also require excessive process steps and additional equipment. These disadvantages have become particularly heightened as advancements have been made in wafer processing and chip fabrication. Packaging technology, at least initially, did not keep pace with such advances.

In reaction to the need for packaging advancements that are suitable for use with more advanced, higher density chips, the industry has developed a packaging technology called chip scale package ("CSP"). The objectives of CSP include providing a package that avoids adding size and bulk to the chip to maintain the profile of the chip. A package area that is less than 1.2 times the chip area is generally considered a CSP. See LAU et al, *CHIP SCALE PACKAGE: DESIGN MATERIALS, PROCESS, RELIABILITY, AND APPLICATIONS* (McGraw-Hill 1999), p.2. There are at least three significant advantages to employing CSP technology: higher component density, more efficient assembly automation, and enhanced product performance.

There are at least 40 types of CSP technology, some being close variations of others. Representative technologies are described in LAU et al, supra. One popular CSP technology uses a thin flexible substrate (interposer), which may be used in a process called "tape automated bonding" (TAB). TAB is particularly useful where extreme package thinness needed. In TAB bonding, an electrical lead system is formed on a thin flexible, tape-like substrate. The lead system may be formed by a patterning process similar to that used in wafer fabrication or by mechanically stamping or chemically bonding the conductive materials of the lead system on to the substrate. The resulting tape appears similar to a camera or movie film, with multiple sets of lead systems spaced along the length of the tape. Tape is provided in reels or frames for use in the packaging process. Like camera or movie film, the tape may have sprocket holes for a sprocketed tape feeder to move the tape over a chip held in a chuck or die mounter. The tape is moved until a lead system aligns with a bonding pad array on a chip. After alignment, the leads are connected to the bonding pads thermosonically with a tool called a thermode or thermosonic bonder. The thermode has a surface that is heated and moved down upon the leads on the tape. The thermode presses the leads downwardly onto the bonding pad array. The heat and pressure of the thermode bond the leads to the pads. After attachment, bonds are covered with encapsulant using a coverlay tape.

One of the better known CSP's using a flexible package is the μ-BGA® flexible interposer of Tessera, in San Jose, Calif. The μ-BGA® interposer has ribbon-like flexible leads for chip level interconnection and a compliant elastomer between the interposer and the chip to relieve stress in the connections arising from the connected structures having different thermal expansion properties. Thermosonic bonding is used to bond the leads on the interposer to the chip's bonding pads.

One advantage of μ-BGA® interposer and similar flexible interposers is that the bonding areas are not restricted to the outer edges of the chip. Thus, a flexible interposer is particularly useful in bonding chips having an array of bonding pads disposed along a central axis of the chip. Therefore, flexible interposers, such as the μ-BGA®, are quite suitable for chips with center bond pads. Most DRAM chips above 16 MB fall into this category.

In many CSP processes, including TAB processes, a liquid encapsulant is applied over interconnections to protect them. The general problems of using encapsulant are applicable to CSP processes.

The encapsulation process poses significant drawbacks relative to flexible interposers for chips with center bond pads. In center bonded packages, the tape interposer overlies the entire surface of the chip, except for an opening in the interposer over the array of bond pads. After leads such as conductive ribbons or other interconnects are pressed down on the bond pads and bonded thereto, the bonds must be encapsulated. After bonding, liquid encapsulant is applied over the interconnections in a cavity defined by a floor of the top surface of the chip and sidewalls of the parallel rows of interconnections and elastomer material interposed between individual interconnects. In such chips, at the opposite ends of the parallel rows of interconnections there is an open passage. The passage results from a gap in assembled material. For example, this passage may be defined by the floor of the top surface of the chip, a ceiling of the downward surface of the tape, and sidewalls of an elastomer material interposed between the floor and ceiling. When encapsulant is applied over the interconnections, the passage is a flow path for encapsulant to places not intended to have encapsulant. This can cause significant problems. For example, if encapsulant flows through a passage beyond the edges of the chip/interposer, then trimming and cleaning of the encapsulant is required. In extreme cases, the packaged chip may even have to be discarded.

Unfortunately, the problem of such encapsulant overflow has not been easily solved. Fashioning the elastomer material interposed between the chip and interposer tape is difficult and has limitations. Therefore, it has not been possible to extend this material so that there is no passage left after the chip is attached to the interposer with elastomer.

For the foregoing reasons, there is a significant need for a solution to the problems of encapsulant overflow. The following portions of this specification describe how the invention disclosed and claimed herein elegantly and efficiently provides a solution to the problem associated with encapsulation overflow.

SUMMARY OF THE INVENTION

The present invention overcomes the problems associated with the prior art by providing a packaged chip and a process for making the packaged chip that eliminates previously needed materials, equipment, and steps for encapsulating chip/package interconnects. The invention is particularly advantageous for encapsulating a center-bonded chip, eliminating the need for a coverlay tape in the encapsulation process.

The present invention also relates to an interposer that includes a dam portion that extends across the flow path of encapsulant, so that the encapsulant does not flow over undesired areas on the die. The present invention further relates to a method for making an interposer with a built-in encapsulant dam.

In one novel embodiment, the present invention provides a packaged chip comprising: a chip having one or more bonding pads disposed away from or off the edges of the chip; an interposer attached to the chip, the interposer having one or more leads interconnected to the one or more bonding pads, at least a portion of the interconnections between leads and bonding pads being covered by an encapsulant; and at least one dam disposed between the chip and interposer and blocking an encapsulant flow path in the package.

In another novel embodiment, the present invention provides a method of forming a packaged chip comprising: providing a chip having one or more bonding pads disposed off the edges of the chip; attaching the chip to an interposer, the interposer having one or more leads for bonding to the bonding pads; interconnecting the leads to the bonding pads to form an interconnection region; placing a dam across an encapsulant flow path in the package being formed; and introducing an encapsulant to at least a portion of the interconnection region.

In another novel embodiment, the present invention provides a method of forming a packaged chip comprising: providing a chip having one or more bonding pads disposed off the edges of the chip; attaching the chip to an interposer comprising a flexible substrate, the interposer having one or more leads for bonding to the bonding pads; interconnecting the leads to the bonding pads to form an interconnection region; placing a dam disposed on the interposer across an encapsulant flow path in the package being formed; and introducing an encapsulant to at least a portion of the interconnection region.

In another novel embodiment, the present invention provides an interposer for attachment to a chip, comprising: a substrate having one or more conductive traces for making electrical connections with bonding pads on a chip; and a dam disposed on the interposer for blocking an encapsulant flow path in a structure resulting from a combination of the interposer with a chip.

In another novel embodiment, the present invention provides an interposer for attachment to a chip, comprising: a flexible substrate having one or more conductive traces electrically connected to one or more leads for interconnecting with bonding pads on a chip, one or more of the leads being off the edge of the interposer for interconnecting with bonding pads off an edge of the chip; and a dam disposed on the interposer for blocking an encapsulant flow path in a structure resulting from a combination of the interposer with a chip, the dam comprising a deflectable structure on the interposer.

In another novel embodiment, the present invention provides a method of forming an interposer for attachment to a chip, comprising: providing a flexible substrate; forming on the substrate conductive traces terminating in a plurality of leads for making electrical connections with bonding pads on a chip; and forming a dam on the interposer for blocking an encapsulant flow path in a structure resulting from an assembly of the interposer with a chip.

In another novel embodiment, the present invention provides a method of forming an interposer for attachment to a chip, comprising: providing a flexible substrate; forming one or more conductive traces on the substrate; forming one or more leads electrically connected to traces for interconnecting with bonding pads on a chip, one or more of the leads being off the edge of the interposer for interconnecting with bonding pads off an edge of the chip; and forming a dam disposed on the interposer for blocking an encapsulant flow path in a structure resulting from a combination of the interposer with a chip, the dam comprising a deflectable structure on the interposer.

The foregoing novel embodiments may include other advantageous features, defining further novel embodiments. Some such features are noted below and may be added to one or more of the foregoing embodiments alone or in combinations. In this regard, the chip may include bonding pads disposed substantially along a central axis with leads from the interposer interconnected thereto so that the package comprises a center bonded package, the package having an encapsulant covering the interconnections, the package having a flow path at at least one end of the centrally disposed interconnections, the flow path being blocked by a dam.

The packaged chip may be designed also to have a dam at each end of the centrally disposed interconnections, each flow path being blocked by a dam. The dam may be disposed on the interposer. The dam may be a structure formed on the surface of the substrate in the package, such as the interposer, the structure being deflectable so as to be positionable across an encapsulant flow path in the package. The dam may be a real or dummy lead on the interposer. The dams may be formed in a process for patterning or stamping conductive material onto the surface of the flexible substrate. More specifically, an interposer may include one or more lead-like structures formed on a surface of the interposer, the leads being deflectable so as to be positionable onto bonding pads on a chip, the dam comprising a lead-like structure on the surface of the interposer using the same type of process as used to form actual leads. The dam may have a surface area oriented substantially perpendicular to leads in the interconnection region. The dam may function to block a flow path in conjunction with a structure on another substrate in a package.

The interposer may include an off-edge array of leads connected to the conductive traces for attaching to a chip with an off-edge array of bonding pads. The interposer may comprise a flexible substrate. The interposer may be a tape substrate used in a TAB bonding process. The interposer may include one or more connectors on the interposer surface, the connectors being connected along a conductive pathway to the interposer leads. The connectors may be solder balls connected along a conductive pathway to the interposer's inner lead system. The interposer may be a substrate having an attached mid-layer substrate material, such as an elastomer, on the chip-attach surface. The chip/interposer assembly may include an interconnection region of parallel rows of bonding pads and connected leads. The dams may be disposed in between the ends of the parallel rows of bonding pads and connected leads. The invention may be used to package a DRAM memory chip.

These and other features of the present invention are described below in more detail.

DETAILED DESCRIPTION OF THE INVENTION

Figure 1:
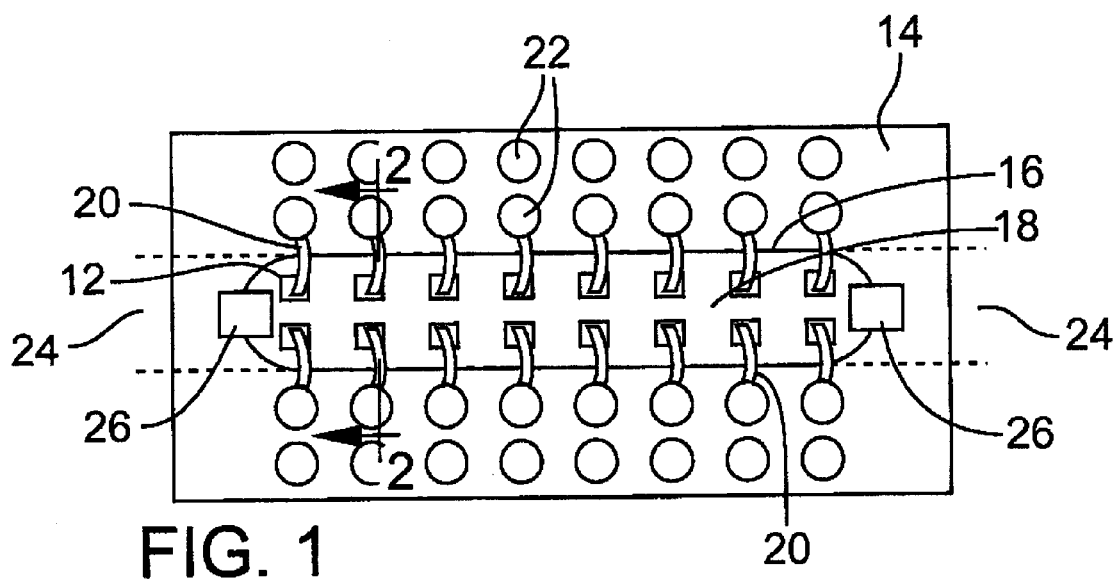
FIG. 1 shows a top view of a chip/interposer assembly with encapsulant dams according to the present invention.

Specific features of the invention will now be discussed in more detail. To illustrate the principles of the present invention, the following description will be in terms of a chip having center bond pads attached to a flexible interposer. However, the invention is not limited to center bonded chips but may be used to encapsulate interconnections on any off-edge location in the chip/interposer assembly. Nor is it intended that the invention be limited to use with flexible interposer substrates. How this invention may be employed in a variety of chip packaging applications will be readily apparent to persons skilled in the art based on the examples given herein.

As used herein, "chip" means a die or device incorporating, in whole or part, silicon substrates, and/or other known or discovered semiconductor materials, components, and assemblies, including, for example, silicon-on-insulator (SOI), silicon-on-sapphire (SOS), thin film transistor (TFT) materials, or germanium, periodic group III–IV materials, II–VI materials, and heteromaterials (II, III, V, VI).

FIGS. 1–4 show one possible embodiment of a packaged chip 1 according to principles of the present invention. (In FIGS. 1–3, the packaged chip 1 is shown before the application of an encapsulant material over connections between chip bonding pads and interposer leads.) In this embodiment, a chip 10 has a plurality of centrally disposed bonding pads 12. Chip 10 is attached circuitry side up to an interposer 13 that includes a flexible substrate 14 with conductive traces 21, mid-substrate 16, and an inner lead system comprising leads 20. An outer lead system comprising connectors 22 are attached to conductive traces 21 that extend between leads 20 and connectors 22. Dams 26 are disposed at opposite ends of the array of interconnections formed by bonding pads 12 and leads 20. The dams 26 are disposed in front of passage 24 (described below), extending from cavity 18 to the outer edge of the chip/interposer.

The flexible substrate 14, with an optional underside of a mid-substrate, such as an elastomer 16, covers the entire surface area of chip 10 but has an opening over the bonding pads 12 so that bonds may be formed between bond pads 12 and leads 20. Accordingly, the assembly of the chip 10 and interposer 13 results in an open elongated cavity 18. The cavity 18 has a floor defined by the top surface of chip 10. Cavity 18 has sidewalls 17, which are formed by elastomer 16 disposed between the chip 10 and interposer substrate 14. The elastomer forms a perimeter for cavity 18. Cavity 18 is filled in with an encapsulant 19 following lead bonding.

Figure 3:
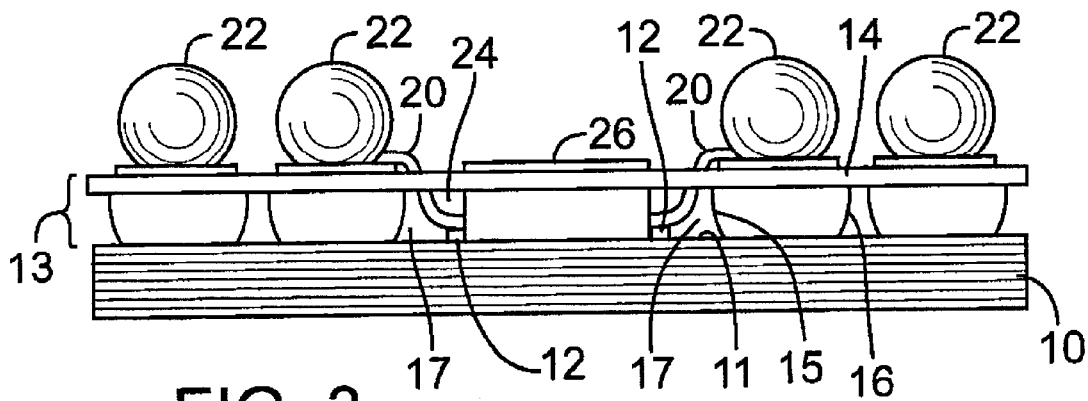
FIG. 3 shows an end view of the chip/interposer assembly of FIG. 1.
Figure 4:
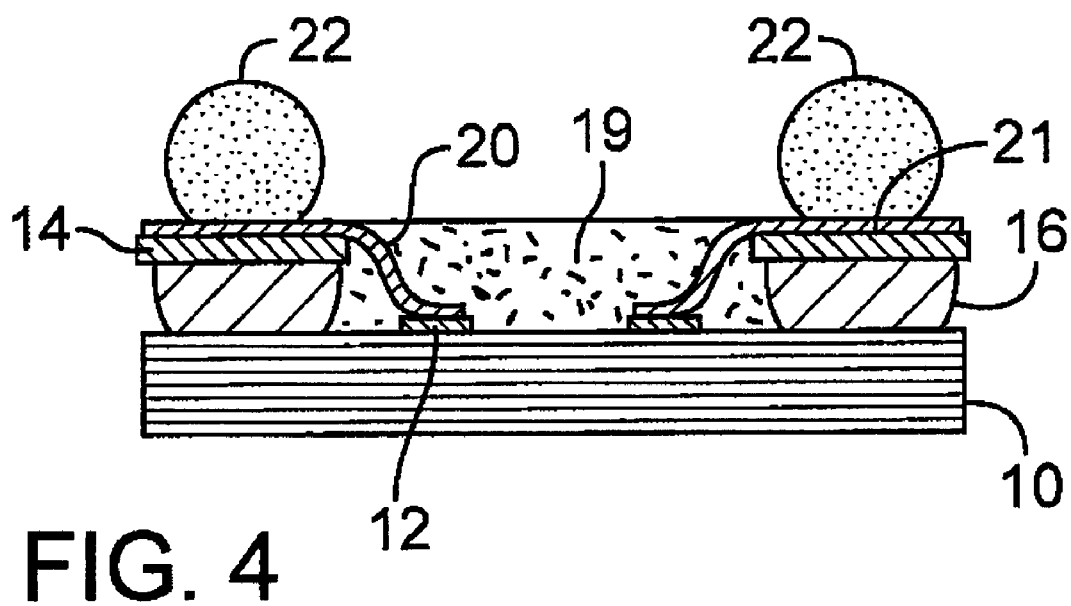
FIG. 4 is the same view as FIG. 2, except that in this case an encapsulant material has been added to the chip/interposer assembly.

As shown in FIGS. 1 & 3, there is a passage 24 at opposing ends of the array of interconnections. Passage 24 may extend from an opening in sidewalls 17 in cavity 18 to an opening at the outer edges of the chip/interposer assembly. A passage 24 is defined by floor 11, which is the top surface of chip 10; a ceiling 15, which is the downward surface of the flexible substrate 14; and sidewalls 17, which are opposing, spaced-apart regions of an mid-substrate 16 interposed between floor 11 and ceiling 15. Therefore, when encapsulant is applied over the interconnections at the bottom of cavity 18, the passage 24 is a flow path for encapsulant 19 into areas of the chip/interposer 13 not intended to have encapsulant. Arrows 25 in FIG. 3 represent theoretical encapsulant flow through passage 24 and out over the edge of the chip/interposer. If dam 26 were not provided in the structure, encapsulant would follow this flow path. However, the present invention provides a dam 26 to block encapsulant from undesirably flowing into unintended areas and passages such as passage 24.

Although passage 24 is represented as a tunnel-like structure open at opposing ends, it may be any volume or area into which a fluid can flow. It can be a pocket or cave-like structure completely enclosed, except for a single opening, or a channel or trough bounded by three sides, or it may be any other fully or partially bounded area. Further, the bounded area may not be completely intact along bounding surfaces, but may include apertures or other spacings.

Bonding pads 12 comprise the electrical terminals on chip 10 used to electrically connect the chip circuitry to the interposer lead system, which includes leads 20, conductive traces 21, and connectors 22. Bonding pads 12 may comprise any conductive material compatible with chip composition, performance, operation, and reliability parameters. A common material used in the industry for meeting such parameters is Al and alloys thereof.

The flexible substrate 14 maybe any of a number of commercially available tapes or other flexible materials known in the art. A suitable material is 50–150 μm polyimide. Using known techniques, the film is coated with a conductive material on each side, one side optionally serving as a ground plane, the other side being formed into leads 20 and their integral traces 21 for I/O redistribution. Traces 21 may comprise any conductive material or combination of materials compatible with substrate composition, performance, operation, and reliability parameters. A common material used in the industry for meeting such parameters is Cu and alloys thereof. The Cu may be plated with Ni and Au.

Mid-substrate 16 is disposed between flexible substrate 14 and chip 10. It may serve at least three purposes. First, it may serve as an agent to bond flexible substrate 14 and chip 10 together. Second, it may serve as a stress decoupler to relieve, stress that may build up in the bonding pad/lead interconnections due to differences in the coefficients of thermal expansion (CTE) for the bonding pads and leads. Third, it may further protect the chip circuitry during the bonding and packaging as a result of the mid-substrate's barrier and/or compressible nature. It may be formulated by persons skilled in the art to be applied between chip 10 and flexible substrate 14 as a continuous layer or in segments. In either case, it may be structured, patterned or segmented along horizontal or vertical planes. Accordingly, the structure or material composition of the mid-substrate 16 will generally be determined by which one or more of the three aforementioned functions are being served by the mid-substrate. Accordingly, for example, the mid-substrate need not extend over the entire chip surface, but can be applied in strips, for example, if it serves one or more of the aforementioned three functions.

For purposes of stress relief, mid-substrate 16 may comprise a low-modulus silicone material, polyimide material, or epoxy-based materials. Suitable thicknesses of a silicone based elastomer layer generally should range from about 50 μm to 200 μm. It should be noted that it is not necessarily essential to have an interposer with a separate mid-substrate layer or layer of another material. It is contemplated that the interposer may comprise a single material for interconnections where stress relief is not an issue or where the single interposer material supplies stress relief or other needed interposer functions.

If a mid-substrate consisting of an elastomer does not have sufficient adhesive properties to render it suitable as the bonding agent for bonding to chip 10 or flexible substrate 14, an adhesive material may be applied between the elastomer and/or the chips of other surface to join the surfaces together.

The mid-substrate is typically screen-printed or punched from a sheet for application to the underside of flexible substrate 14 or screen printed thereon. One problem with conventional elastomer materials used as a mid-substrate 16 is producing a continuous layer that leaves no passages between the chip and interposer, particularly passages adjacent areas to be encapsulated. Passages 24 are examples of such problem areas. The conventional printing and stamping techniques do not adequately allow the volume comprising passage 24 to be filled with elastomer. This is because it is difficult to mold or fit elastomer to the narrow bridge of flexible substrate at the ends of the chip/interposer above passages 24.

Leads 20 may comprise wire, ribbon, or other known conductive structures that can form a bond with the bonding pads 12 on chip 10. A preferred lead structure is one that has some malleability or flexibility so that the leads' terminal portions may be repositioned from the interposer 13 onto bonding pads 12 of chip 10. Leads 20 may be made of any conductive material that is compatible with chip and package composition, performance, operation, and reliability parameters. Suitable lead materials include Au, Cu and Al and alloys thereof. More specifically, an example of a suitable lead for use with flexible substrate 14, described above, is a soft Au lead with a width of about 25 μm and thickness of 20–25 μm. Of course, other structures, materials and dimensions will be readily apparent to persons skilled in the art depending on the nature of the bonding pads, interposer, and chip performance and operational parameters for any particular application. The leads 20 on flexible substrate 14 or other interposer may be formed, along with traces 21, using conventional metal patterning or stamping technologies.

Figure 2:
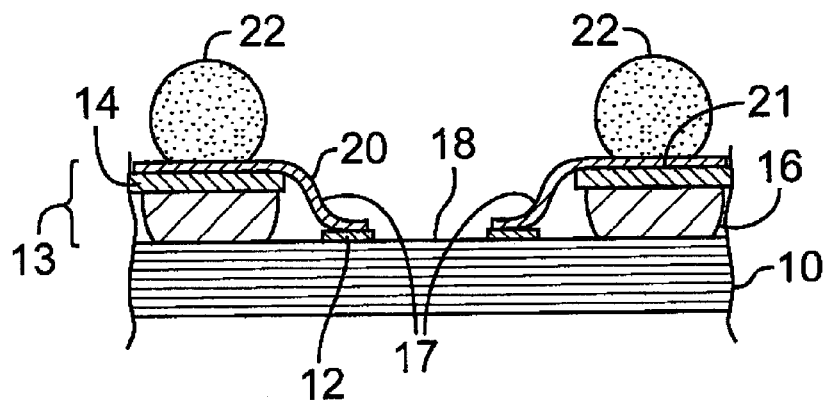
FIG. 2 shows a cross-section of the chip/interposer assembly of FIG. 1, along line 2—2.

The leads 20 may be bonded to bonding pads 12 by a thermosonic bonding process or other known process. Preferably, the initial formation or the deflection of leads 20 gives them a curved or somewhat folded structure, as seen in FIG. 2. This structure allows the leads to compensate for thermal expansion by straightening.

After bonding pads 12 and leads 20 are bonded together to form interconnections, the interconnections must be encapsulated. To prevent encapsulant from entering passage 24, one or more dams 26 are provided on interposer 13.

Prior to encapsulation, dam 16 is placed across selected flow paths to block encapsulant from flowing therein when encapsulant is applied. As shown in the Figures, dams 26 are disposed to block flow into passage 24. Depending on an encapsulant's viscosity, it may not be necessary for a dam 26 to completely seal a flow path. For example, with a relatively viscous encapsulant, surface tension forces between the dam and the encapsulant will prevent the encapsulant from flowing between spaces between the dam 26 and the passage, e.g., passage 24, providing the flow path.

The dam 26 may comprise a unit of material or materials that are formed on or attached to the interposer, the chip, and/or other substrate in or on the packaging materials. Whatever the attachment substrate may be, the dam 26 must be disposed adjacent a flow path to be blocked. The dam may be fashioned to a size, shape, and structure to effect blockage. This may vary from chip to chip, but can be readily ascertained based on an inspection of a chip/interposer assembly. The dam may be attached to a chip/interposer 1 or other package substrate in a position adjacent the passage to be blocked. The attachment may be with adhesives, solder, or other available bonding means.

It is contemplated that dam 26 may consist of multiple parts. For example, one part of the dam may reside on the chip, interposer or other package substrate, and another part of the dam may reside on one or more other package substrates. When the substrates are assembled, the separate pieces of the dam are in contact with each other, or in such close proximity, so that they collectively function to close a flow path. It is also contemplated that the dam may comprise a free structure that is placed in front of a flow path prior to the application of an encapsulant. Such a unit could be held in position by surrounding structures, for example. Or it could be attached to a package substrate by available bonding means known in the art.

Preferably, dam 26 is preformed on an interposer 13 prior to attachment of the interposer to the chip. In one preferred embodiment, the dams 26 comprise a real lead, a dummy lead, or other lead-like structure (which may also be collectively referred to hereinafter after as a "lead dam") disposed on the interposer. An advantage of a lead dam is that it may be formed in the same process, using the same materials, as for all other leads. The lead dam may differ from actual leads in terms of dimensions and positions. For example, it is contemplated that a lead dam would typically be larger than actual leads so that it corresponds to the size of the passage to be blocked. Similarly, a lead dam may vary in shape, structure and position relative to actual leads, as necessary to effect blockage of a particular flow path (also factoring the flow properties of a particular encapsulant). Therefore, advantageously, there are no additional processing steps, material requirements, or equipment involved in providing a lead dam.

In the case of a flexible substrate 14, a lead dam 26 may be formed on the substrate, for example, by patterning or stamping a conductive lead material in the manner previously described for leads 20. The lead dam 26 may be deflected downwardly to block passage 24 in the same manner as leads 20 are pressed onto bonding pads 12. As shown in FIG. 3, lead dams 26 are oriented perpendicularly relative to leads 20, across passage 24, thereby placing the broad side of the lead across the passage to be blocked. The terminal ends of lead dam 26 may be bonded to the die or left un-bonded. The lead dam may or may not be connected to conductive traces 21.

The embodiments shown in the Figures are examples of flow passages, dams, and their respective locations. It may be the case, and is within the contemplation of the present invention, that more or less dams, passages, and locations therefor may occur, depending on the nature of the chip and packaging components, and their structural arrangement and relationship. Accordingly, it is believed that persons skilled in the art will be readily able to employ and adapt the teaching of this invention in a variety of chips packaging situations.

Once dams 26 are in position, encapsulant may be applied using conventional methods. If desired, encapsulant 19 may be applied over the edges or backside of the chip/interposer assembly. Generally speaking, liquid encapsulant is applied over the interconnections, and other desired surfaces of the interposer and/or chip, using known or available encapsulation materials and techniques. Common encapsulant materials include silicones and epoxies.

Figure 6:
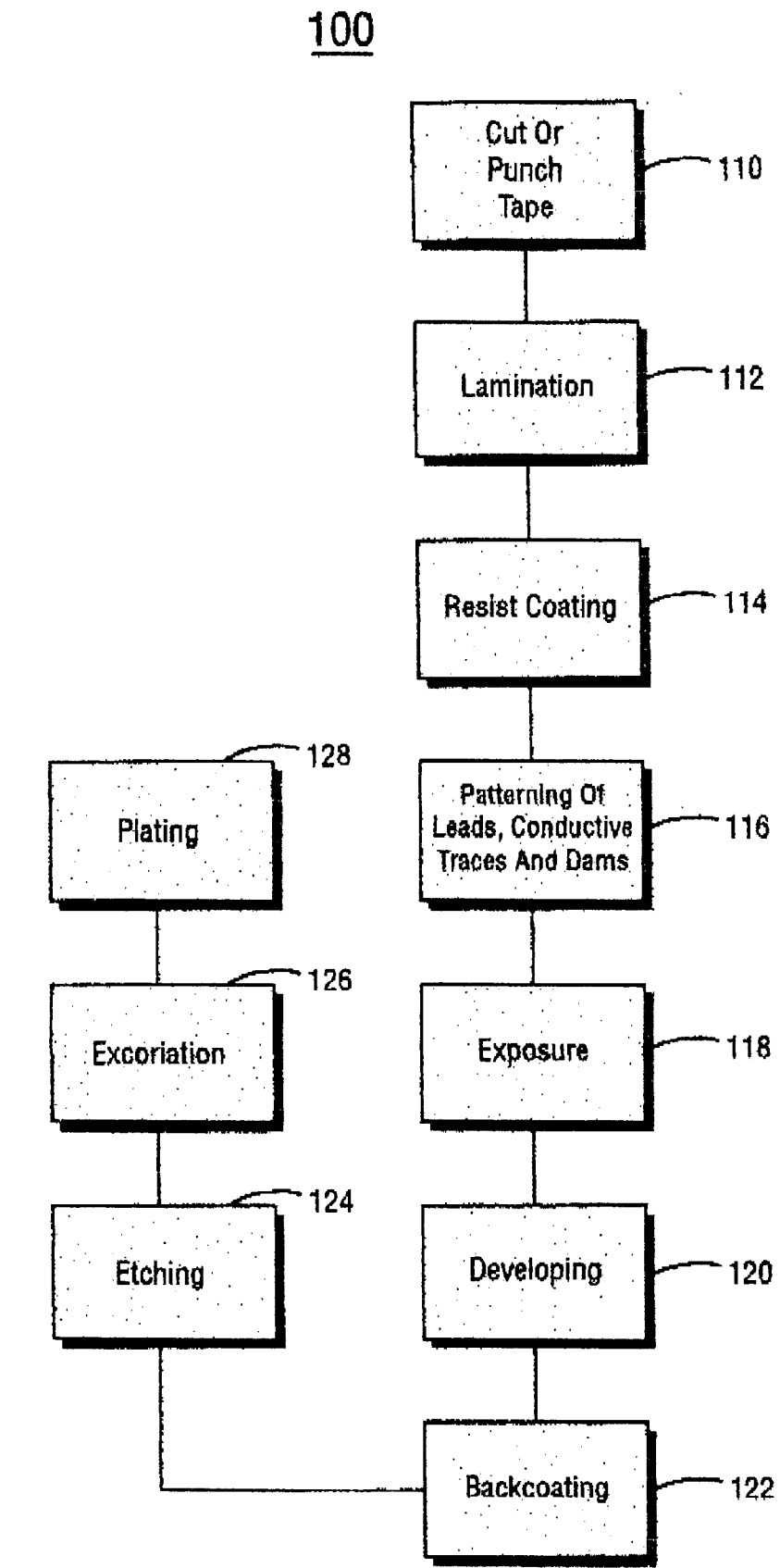
FIG. 6 shows production flow steps for making an interposer that includes an encapsulant dam according to the present invention.
Figure 7:
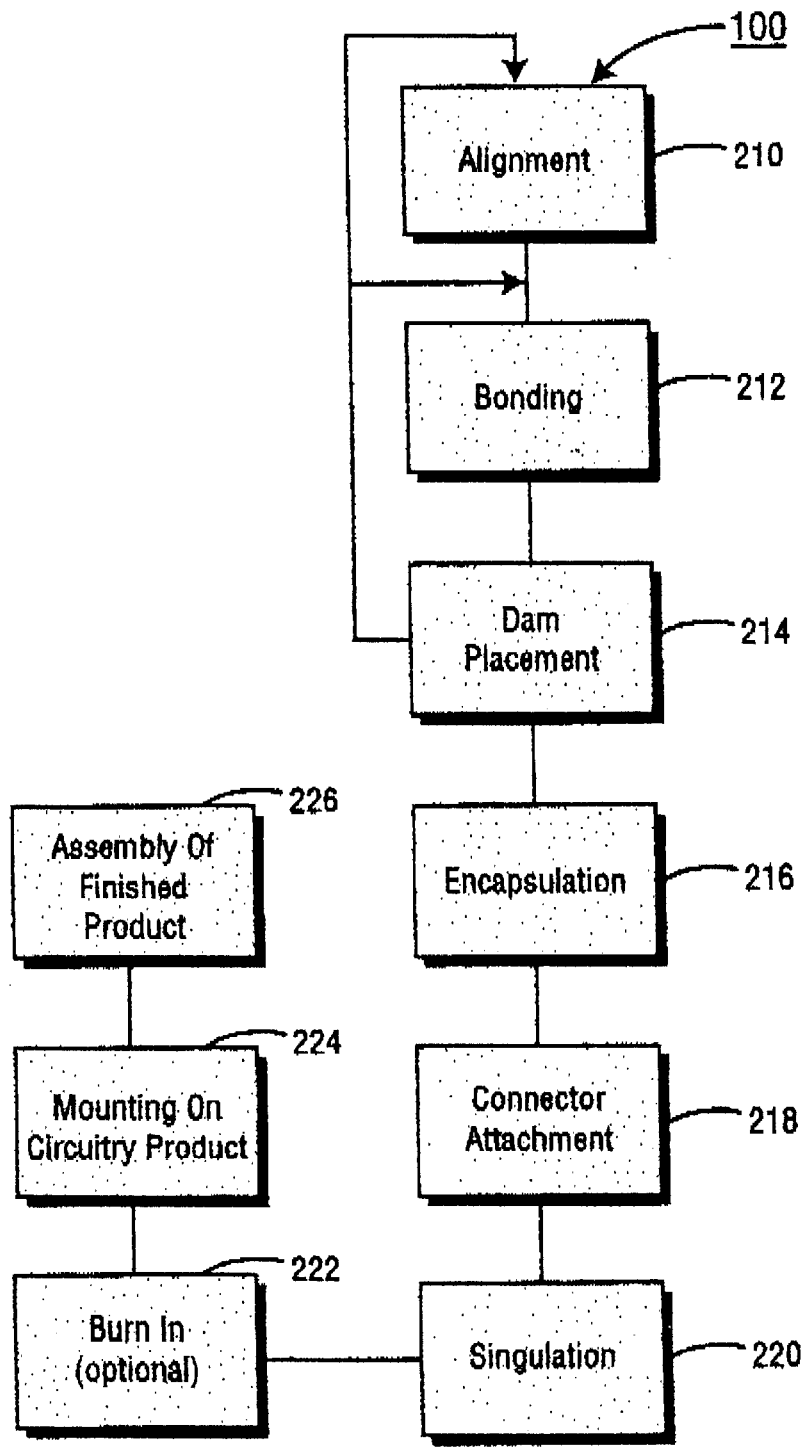
FIG. 7 shows production flow steps for packaging a chip, the package including an encapsulant dam according to the principle of the present invention.

FIGS. 6–7 show process steps for packaging a chip according to the teachings of this invention, and for making an interposer used in the packaging.

Following encapsulation, connectors 22 are applied to traces 21. The connectors may comprise any known connector known in the art, including eutectic solder balls, as shown in the Figures, or wire leads.

FIG. 6 shows the general production flow 100 for making an interposer according to one possible embodiment of the present invention. A flexible base tape may be obtained from various commercial sources, including Minnesota Mining & Manufacturing Company, St Paul, Minn. and others selling TAB tapes. In step 110, the tape may be cut or punched to correspond to the area on the chip it will cover. In step 112, a conductive foil is laminated to the tape. In step 116, a resist coating is patterned on the laminate to define conductive traces, leads, and lead dams. This step is followed, respectively by exposure 118, developing 120, backcoating 122, etching 124, excoriation 126, and plating steps. Except for the novel formation of a lead dam, the foregoing steps involve conventional materials, processing, and equipment, all of which are known or readily ascertainable by persons skilled in the art.

FIG. 7 shows the general production flow 200 for forming a packaged chip using a flexible interposer such as a tape produced in production flow 100, shown in FIG. 6. The tape may include an elastomer and/or adhesive underside layer. The tape is typically supplied in reels or frames. In step 210, representing a TAB process, the chip is placed in a chip mounter. The chip mounter includes means for holding the flexible substrate (tape), moving it by frames, and aligning individual frames with individual chips. Once aligned, the leads on the tape are deflected onto the chip's bonding pads and thermosonically attached into a single point bond in step 212. In the case of lead dams, they too would preferably be deflected in this process. In any case, dams are positioned in step 214 following lead bonding or at any other time prior to the step of encapsulation. Encapsulant is applied over bonds in step 216. In step 218, solder balls or other connectors are attached to conductive traces on the package, followed in step 220 by singulation of packaged chips from the tape. Sawing or punching may be used, for example, to singulate packaged chips. An optional burn in may be performed in step 222 to ensure functionality of the packaged chip.

Figure 5:
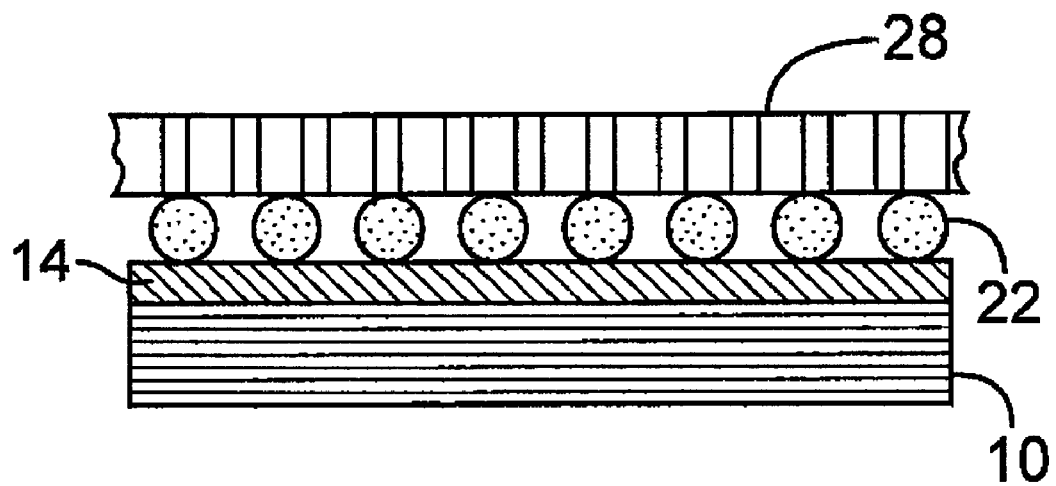
FIG. 5 shows a side view of the chip/interposer assembly of FIG. 1, in this case, the assembly is attached to a circuit board.

Following packaging, the packaged chip may be mounted 224 on a circuit board, to another packaged chip or another circuitry product using conventional or known techniques. FIG. 5 shows a packaged chip 2 mounted to a circuitry product 28, such as a PCB. The assembly of the packaged chip may be further assembled 226 into a computer or other electronics product.

Presently, techniques are being developed for packaging chips while the chips are still on a wafer. The principles of the present invention are contemplated for use in packaging chips still on a wafer or a portion of a wafer. A pre-formed dam would be particularly suitable for such wafer level packaging.

What I claim:

1. A method of forming a packaged chip comprising:
   providing a chip having one or more bonding pads located substantially centrally of the chip;
   attaching the chip to an interposer forming an encapsulant flow path therebetween, the interposer having one or more leads for bonding to the bonding pads;
   interconnecting the leads to the bonding pads to form an interconnection region;
   placing a dam between the interposer and the chip to extend across the encapsulant flow path in the package; and
   introducing an encapsulant to at least a portion of the interconnection region.

2. The method of claim 1 wherein the dam is disposed on the interposer.

3. The method of claim 2 wherein the interposer comprises a flexible substrate.

4. The method of claim 3 wherein the chip has bonding pads disposed substantially along a central axis with leads from the interposer interconnected thereto so that the package comprises a center bonded package, the package having an encapsulant covering the interconnections, the package having an encapsulant flow path adjacent least one end of the centrally disposed interconnections, the encapsulant flow path being blocked by a dam.

5. The method of claim 4 wherein a dam is located at each end of the centrally disposed interconnections to block each encapsulant flow path.

6. The method of claim 4 wherein the dam comprises a lead dam.

7. The method of claim 5 wherein each dam comprises a lead dam on the interposer.

8. The method of claim 1 wherein the interposer includes one or more connectors on an interposer surface, the connectors being connected along a conductive pathway to the interposer leads.

9. The method of claim 3 wherein the interposer includes one or more connectors comprising solder balls on an interposer surface, the solder balls being connected along a conductive pathway to the interposer leads.

10. A method of forming a packaged chip comprising:
providing a chip having one or more bonding pads located substantially centrally of the chip;
attaching the chip to an interposer comprising a flexible substrate forming an encapulant flow path therebetween, the interposer having one or more leads for bonding to the bonding pads;
interconnecting the leads to the bonding pads to form an interconnection region;
placing a dam disposed on the interposer between the interposer and the chip to extend across the encapsulant flow path in the package; and
introducing an encapsulant to at least a portion of the interconnection region.

11. The method of claim 10 wherein the interposer comprises a tape substrate used in a TAB bonding process.

12. The method of claim 10 wherein the package has a dam blocking encapsulant flow paths at opposing ends of the interconnection region.

13. The method of claim 10 wherein the dam comprises a lead dam on the interposer.

14. The method of claim 13 wherein the dam has a surface area oriented substantially perpendicular to leads in the interconnection region.

15. The method of claim 13 wherein the interconnection region comprises parallel rows of bonding pads and connected leads, at least one dam being disposed in between the ends of the parallel rows of bonding pads and connected leads.

16. The method of claim 10 wherein the package further includes connectors comprising solder balls.

17. The method of claim 10 wherein the interposer includes an attached elastomer on the chip-attach surface for stress decoupling in the interconnections.

18. The method of claim 17 wherein the chip is a DRAM memory chip.

19. A method of forming an interposer for attachment to a chip, comprising:
providing a flexible substrate having a chip-attach area for attachment to a chip;
forming on the substrate conductive traces terminating in a plurality of leads for making electrical connections with bonding pads on a chip; and
forming a dam on the interposer within the chip-attach area to extend between the interposer and the chip for blocking an encapsulant flow path formed from an assembly of the interposer with the chip.

20. The method of claim 19 wherein the dam comprises a structure formed on the surface of the substrate, the structure being deflectable from the surface so as to be positionable across the encapsulant flow path in an assembly of the interposer to the chip.

21. The method of claim 20 wherein the dam comprises a real or dummy lead formed on the surface of the interposer.

22. The method of claim 20 further comprising the step of attaching an elastomer on the chip-attach surface for stress decoupling in interconnections made between leads formed on the interposer and bonding pads on the chip.

23. The method of claim 19 wherein leads are formed in an off-edge array for attachment to bonding pads on the chip in an off-edge array.

24. A method of forming an interposer for attachment to a chip, comprising:
providing a flexible substrate having a chip-attach area for attachment to a chip;
forming one or more conductive traces on the substrate;
forming one or more leads electrically connected to traces for interconnecting with bonding pads on a chip, one or more of the leads being located substantially centrally of the interposer for interconnection with bonding pads located substantially centrally of the chip; and
forming a dam disposed on the interposer to extend between the interposer and the chip for blocking an encapsulant flow path in a structure resulting from a combination of the interposer with the chip, the dam comprising a deflectable structure on the interposer positioned within the chip attach area of the substrate.

25. The method of claim 24 wherein an elastomer is attached on the interposer's chip-attach surface for stress decoupling in interconnections made between leads formed on the interposer and bonding pads on a chip.

26. The method of claim 25 wherein the dam comprises a real or dummy lead formed on the surface of the interposer.

27. The method of claim 26 wherein the leads and dam are formed in a process for patterning or stamping conductive material onto the surface of the flexible substrate.

28. The method of claim 25 wherein the interposer has leads disposed on its surface in a centrally disposed array for forming a center bonded package with the chip having central array of the bonding pads, at least one dam being provided at one or both ends of the centrally disposed leads for blocking the encapsulant flow path formed at the ends of the array when the interposer is attached to the chip.

29. A method of forming a packaged chip comprising:
providing a chip having one or more bonding pads thereon spaced away from outer edges of the chip substantially along a central axis;
attaching the chip to an interposer comprising a flexible substrate and having at least one dam disposed thereupon, the interposer having one or more leads for bonding to the bonding pads;
interconnecting the leads to the bonding pads to form an interconnection region; wherein the dam is constructed and arranged to extend between the interposer and the chip to block flow of encapsulant along a flow path, the flow path being formed between the chip and the interposer at one or both ends of the centrally disposed interconnections; and
introducing an encapsulant to at least a portion of the interconnection region to cover interconnections.

30. The method of claim 29 wherein a dam is located at each end of the centrally disposed interconnections to block each encapsulant flow path.

31. The method of claim 29 wherein the dam comprises a lead dam.

32. The method of claim 30 wherein each dam comprises a lead dam on the interposer.

33. A method of forming a packaged chip comprising:

providing a chip having one or more bonding pads located substantially centrally of the chip;

attaching the chip to an interposer comprising a flexible substrate having a chip-attach area within which the chip is attached, the interposer having one or more leads for bonding to the bonding pads;

interconnecting the leads to the bonding pads to form an interconnection region;

placing a dam disposed on the interposer within the chip-attach area between the interposer and the chip to extend across an encapsulant flow path in the package, wherein the dam comprises a lead dam on the interposer; and introducing an encapsulant to at least a portion of the interconnection region.

34. The method of claim 33 wherein the dam has a surface area oriented substantially perpendicular to leads in the interconnection region.

35. The method of claim 33 wherein the interconnection region comprises parallel rows of bonding pads and connected leads, at least one dam being disposed in between the ends of the parallel rows of bonding pads and connected leads.

36. A method of forming an interposer for attachment to a chip, comprising:

providing a flexible substrate having a first surface and a second surface opposing the first surface;

forming on the first surface of the substrate conductive traces terminating in a plurality of leads for making electrical connections with bonding pads on a chip forming a chip-interposer assembly; and forming a dam on the interposer to extend between the interposer and the chip for blocking an encapsulant flow path formed between the interposer and the chip, wherein the dam is disposed on the interposer so as to reside inside the perimeter of the chip-interposer assembly, and wherein the dam comprises a structure formed on the first surface of the substrate, the structure being deflectable from the first surface toward the second surface so as to be positionable across the flow path.

37. The method of claim 36 wherein the dam comprises a real or dummy lead formed on the surface of the interposer.

38. A method of forming an interposer for attachment to a chip, comprising:

providing a flexible substrate having a fist surface and a second surface through which the substrate is attached to a chip;

forming one or more conductive traces on the first surface of the substrate;

forming one or more leads electrically connected to traces for interconnecting with bonding pads on the chip, one or more of the leads being located substantially centrally of the substrate for interconnection with bonding pads located substantially centrally of the chip, wherein an elastomer is attached on the second surface for stress decoupling in interconnections made between the one or more leads and the bonding pads; and forming a dam disposed on the interposer to extend between the interposer and the chip for blocking an encapsulant flow path in a structure resulting from a combination of the interposer with the chip, the dam comprising a deflectable structure on the interposer, wherein the dam comprises a real or dummy lead formed on the first surface of the substrate and extend towards the second surface of the substrate.

39. The method of claim 38 wherein the leads and the dam are formed in a process for patterning or stamping conductive material onto the surface of the flexible substrate.

40. A method of forming an interposer for attachment to a chip, comprising:

providing a flexible substrate;

forming one or more conductive traces on the substrate;

forming one or more leads electrically connected to traces for interconnecting with a central array of bonding pads on a chip, one or more of the leads being located substantially centrally of the interposer for interconnection with bonding pads located substantially centrally of the chip, the leads being disposed on a first surface of the substrate in a centrally disposed array forming a center-bonded package with the chip; wherein an elastomer is attached to a second surface of the substrate for stress decoupling in interconnections made between leads and the bonding pads; and forming a dam disposed on the interposer to extend between the interposer and the chip for blocking an encapsulant flow path in a structure resulting from a combination of the interposer with the chip, the dam comprising a deflectable structure on the interposer provided at one or both ends of the centrally disposed leads for blocking the flow path formed at the ends of the array when the interposer is attached to the chip.

41. A method of forming a packaged chip comprising:

providing a chip having one or more bonding pads disposed substantially along a central axis of the chip;

attaching the chip to an interposer, the interposer having one or more leads for bonding to the bonding pads;

interconnecting the leads to the bonding pads to form an interconnection region;

placing a dam between the interposer and the chip to extend across an encapsulant flow path formed between the interposer and the chip; and introducing an encapsulant to at least a portion of the interconnection region; the dam preventing the encapsulant from flowing out of the interconnection region.

42. A method of forming a packaged chip comprising:

providing a chip having one or more bonding pads disposed substantially along a central axis of the chip;

attaching the chip to an interposer comprising a flexible substrate, the interposer having one or more leads for bonding to the bonding pads;

interconnecting the leads to the bonding pads to form an interconnection region;

placing a dam disposed on the interposer between the interposer and the chip to extend across an encapsulant flow path formed between the interposer and the chip; and introducing an encapsulant to at least a portion of the interconnection region; the dam preventing the encapsulant from flowing out of the interconnection region.

43. A method of forming a packaged chip comprising:

providing a chip having one or more bonding pads thereon;

attaching the chip to an interposer forming an encapsulant flow path therebetween, the interposer having one or more leads for bonding to the bonding pads;

interconnecting the leads to the bonding pads to form an interconnection region;

placing a dam between the interposer and the chip to extend across the encapsulant flow path; and introducing an encapsulant to at least a portion of the interconnection region.

44. A method of forming a packaged chip comprising:

providing a chip having one or more bonding pads thereon;

attaching the chip to an interposer comprising a flexible substrate having at least one dam disposed thereon; the interposer having one or more leads for bonding to the bonding pads;

interconnecting the leads to the bonding pads to form an interconnection region having opposed ends, an encapsulant flow path formed between the chip and the interposer at the opposed ends of the interconnection region; and introducing an encapsulant to at least a portion of the interconnection region to cover the interconnections between the leads and bonding pads, the dam being constructed and arranged to extend between the interposer and the chip to block the flow of encapsulant from the interconnection region.

45. A method of forming a packaged chip comprising:

providing a chip having one or more bonding pads thereon;

attaching the chip to an interposer comprising a flexible substrate having at least one dam disposed thereon, the interposer having one or more leads for bonding to the bonding pads;

interconnecting the leads to the bonding pads to form an interconnection region located within a cavity formed between the chip and the interposer; and introducing an encapsulant to at least a portion of the interconnection region, the dam being positioned between the interposer and the chip to prevent encapsulant from flowing out of the cavity.

* * * * *